United States Patent
Tuncer

(10) Patent No.: US 11,552,013 B2
(45) Date of Patent: Jan. 10, 2023

(54) FUSES FOR PACKAGED SEMICONDUCTOR DEVICES

(71) Applicant: Texas Instruments Incorporated, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 100 days.

(21) Appl. No.: 17/218,941

(22) Filed: Mar. 31, 2021

(65) Prior Publication Data

US 2022/0319988 A1 Oct. 6, 2022

(51) Int. Cl.
*H01L 23/525* (2006.01)
*H01L 23/498* (2006.01)
*H01L 23/00* (2006.01)

(52) U.S. Cl.
CPC .... *H01L 23/5256* (2013.01); *H01L 23/49816* (2013.01); *H01L 24/32* (2013.01); *H01L 24/48* (2013.01); *H01L 2224/32225* (2013.01); *H01L 2224/48175* (2013.01)

(58) Field of Classification Search
CPC ........... H01L 23/5256; H01L 23/49816; H01L 24/32
See application file for complete search history.

(56) References Cited

U.S. PATENT DOCUMENTS

| | | | | |
|---|---|---|---|---|
| 5,682,057 A * | 10/1997 | Kuriyama | ............ | H01H 37/761 257/E23.044 |
| 9,865,537 B1 * | 1/2018 | Male | .................. | H01L 23/5256 |
| 2004/0109275 A1 * | 6/2004 | Whitney | ................ | H01C 7/021 361/93.1 |
| 2007/0176258 A1 * | 8/2007 | Fujiki | ..................... | H01L 24/05 257/E23.15 |
| 2012/0061796 A1 * | 3/2012 | Wang | ..................... | H01L 24/05 438/600 |
| 2022/0208676 A1 * | 6/2022 | Tuncer | .................. | H01L 23/481 |

OTHER PUBLICATIONS

Texas Instruments Incorporated, "Enhanced HotRod QFN Package:Achieving Low EMI Performance in Industry's Smallest 4-A Converter", Application Report SNVA935, pp. 1-12, Jun. 2020; accessed Mar. 30, 2021, https://www.ti.com/lit/an/snva935/snva935. pdf?ts=1617208855579&ref_url=https%253A%252F%252Fwww. google.com%252Fh.
Heraeus Electronics, "Bonding Wire for Semiconductor Technology", Brochure, pp. 1-24, Sep. 2017; accessed Mar. 31, 2021, https://www.heraeus.com/media/media/het/doc_het/products_and_ solutions_het_documents/bonding_wires_documents/Brochure_ Bonding_Wire.pdf.

* cited by examiner

Primary Examiner — Errol V Fernandes
(74) Attorney, Agent, or Firm — Dawn Jos; Frank D. Cimino

(57) ABSTRACT

In a described example, an apparatus includes: a package substrate having a die pad configured for mounting a semiconductor die, and leads spaced from the die pad; a semiconductor die mounted on the die pad; a fuse mounted to a lead, the fuse having a fuse element coupled between a fuse cap and the lead, the fuse having a fuse body with an opening surrounding the fuse element, the fuse cap attached to the fuse body; electrical connections coupling the semiconductor die to the fuse; and mold compound covering the semiconductor die, the fuse, the electrical connections, and a portion of the package substrate, with portions of the leads exposed from the mold compound to form terminals.

28 Claims, 8 Drawing Sheets

FUSES FOR PACKAGED SEMICONDUCTOR DEVICES

TECHNICAL FIELD

This relates generally to packaging electronic devices, and more particularly to packaging for semiconductor devices including a fuse within the package.

BACKGROUND

For semiconductor devices produced for supplying power and for load driving applications, fuses are used to protect a load or system from an overcurrent. For example, when a power device is delivering current to a load or system, a fuse may be coupled to an output signal so that if an overcurrent condition arises, the fuse will open, stopping current to the load before the load is damaged. Discrete fuses are large passive elements that require space on a system board or module. Package on package arrangements are possible where a fuse is mounted to a packaged device, but at the cost of an increased complexity and increased package cost.

SUMMARY

In an example an apparatus includes: a package substrate having a die pad configured for mounting a semiconductor die, and leads spaced from the die pad; a semiconductor die mounted on the die pad; a fuse mounted to a lead, the fuse having a fuse element coupled between a fuse cap and the lead, the fuse having a fuse body with an opening surrounding the fuse element, the fuse cap attached to the fuse body; electrical connections coupling the semiconductor die to the fuse; and mold compound covering the semiconductor die, the fuse, the electrical connections, and a portion of the package substrate, with portions of the leads exposed from the mold compound to form terminals.

DETAILED DESCRIPTION

Figure 1:
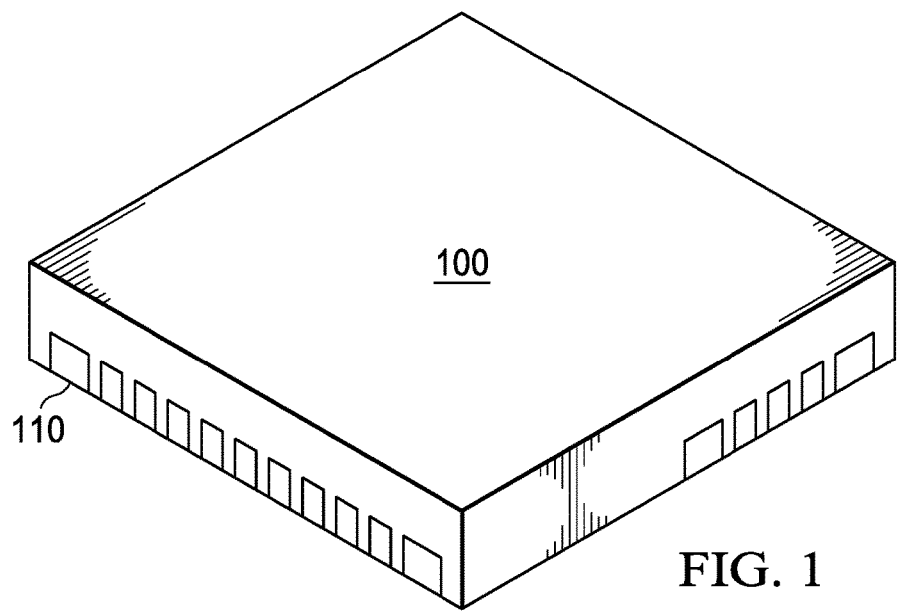
FIG. 1 is a projection view of a flip-chip packaged electronic device in a quad flat no-leads (QFN) package.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor device can be a micro electro-mechanical system (MEMS) device, such as a digital micromirror device (DMD). Semiconductor dies for power applications include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing away from the package substrate and a backside surface facing and mounted to the package substrate. Alternatively, the semiconductor die can be flip-chip mounted with the active surface facing the package substrate surface, and the semiconductor die mounted to the leads of the package substrate by conductive columns or solder balls. The packaged electronic device can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the package substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. In the arrangements, a pre-molded package substrate includes a thermal slug incorporated into a dielectric material, the thermal slug has surfaces exposed from the dielectric material to facilitate thermal transfer, and has surfaces exposed in a die mount area to enable semiconductor dies to be mounted directly on the thermal slug, further facilitating thermal transfer.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements. A quad flat plastic package, or QFP, can be used with the arrangements.

The term "fuse element" is used herein. As used herein a fuse element is a conductive element that carries current, and which will melt when a current over a predetermined fusing current flows, opening an electrical connection and stopping the current. In the arrangements the fuse elements are of a conductive wire or ribbon.

In the arrangements, the problem of providing a protective fuse with semiconductor devices is solved by use of a fuse incorporated into a semiconductor device package. In the arrangements, the fuse includes a fuse element, for example a bond wire or ribbon bond, extending from a conductive lead in the package to a conductive plate forming a fuse cap. The fuse element is placed within a cavity in a protective fuse body, such as a cylindrical or rectangular column. The fuse is electrically coupled in series with a semiconductor device in the package, so that all of the current through a signal from the semiconductor device to the lead is coupled through the fuse element. The fuse element is sized to be able to carry normal current to a load, but is sized to burn up, melt and open when a predetermined excess current is flowing to the load. By melting and opening when excess current begins to flow, the fuse protects external circuitry coupled to the semiconductor device. Electrical connectors such as bond wires or ribbon bonds are used to connect the fuse cap to the semiconductor device, putting the fuse in series between a bond pad on the semiconductor device and the lead, a portion of the lead forming an external terminal for the packaged device. The fuse, the conductive lead, the bond wires, and the semiconductor device are covered by a dielectric material that forms the body of the packaged semiconductor device, this dielectric material may be an epoxy resin mold compound.

In some arrangements the fuse element, the fuse body, and the fuse cap are formed or placed contemporaneously with other packaging steps used to package the semiconductor device, these fuses are formed "in situ" and contemporaneously with packaging a semiconductor device. In alternative arrangements the fuse is manufactured separately as a complete passive component, and the fuse component is mounted on the lead prior to or during packaging of the semiconductor device. Various alternative arrangements are described herein for forming the fuse. By placing the fuse element within a cavity in a protective body, the fuse element is physically isolated from mold compound, preventing unwanted conductive paths from forming in the mold compound when the fuse melts, and increasing the reliability of the fuse. By using bond wires or ribbon bonds to form the fuse element, the arrangements are compatible with and can be formed simultaneously with existing semiconductor packaging steps, so that the use of the fuses of the arrangements is efficient and requires few changes to existing processes, and no new materials, lowering costs. By incorporating the fuses of the arrangements inside packaged devices, the need for external components is eliminated or reduced, saving board area and simplifying board design. The fuses of the arrangements are sized to fit on a package lead without modifying an existing lead pattern, and within the size of the device package.

FIG. 1 illustrates a packaged electronic device 100 in a quad flat no lead (QFN) package. The packaged electronic device 100 has a body that may be formed from a thermoset mold compound, such as epoxy resin. Other mold compounds, such as resins, epoxies, or plastics can be used. Leads 110 are part of a package substrate that supports a semiconductor die (not visible, as it is obscured by the package 100) mounted within the package, the leads 110 are exposed from the mold compound and form electrical terminals for the packaged device. The packaged electronic device 100 can be mounted to a circuit board using surface mount technology (SMT). Package sizes are continually decreasing, and currently can be several millimeters on a side to less than one millimeter on a side, although larger and smaller sizes are also used. Future package sizes will be smaller than one millimeter on a side as semiconductor devices continue to be smaller. The QFN package is increasingly used to package semiconductor devices, it has advantages (when compared to other package types) in that the leads are within the boundary of the package body, so that the QFN package makes efficient use of system board area (when compared to leaded packages.) Although QFN packages such as 100 in FIG. 1 are increasingly used for semiconductor devices, the arrangements can also be used with leaded packages such as dual in-line packages (DIPs). The arrangements can also be used with discrete transistor packages such as small outline packages (SOPs) and with "can" packages, small outline integrated circuit (SOIC) packages, transistor outline (TO) packages, or "metal case" packages used for power transistors.

Figure 2:
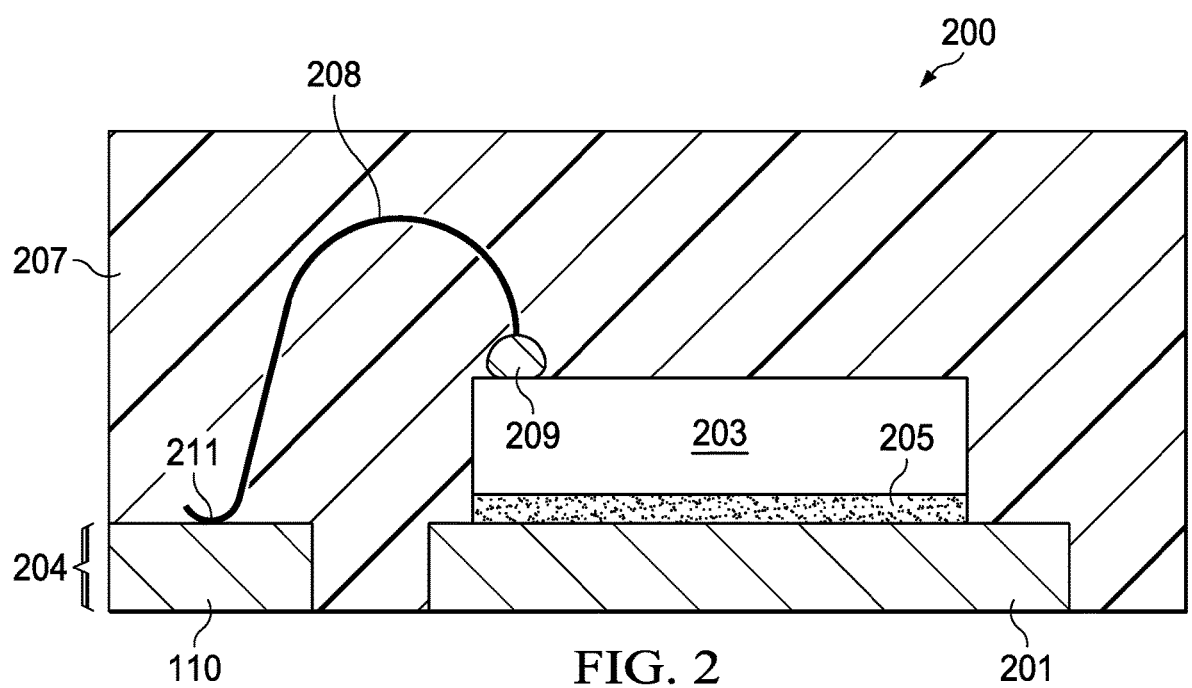
FIG. 2 is a cross section of a flip-chip packaged electronic device.

FIG. 2 illustrates, in a cross sectional view, package 200. In this example package 200 is a QFN package. In alternative arrangements a leaded package, such as a quad flat plastic (QFP) package can be used. A semiconductor device 203 is shown mounted to a package substrate 204. Package substrate 204 can be a lead frame, such as a metal lead frame. In an example a copper lead frame is used. Other package substrates such as pre-molded lead frame (PMLF) or a molded interconnect substrate (MIS) can be used. A die pad 201 is shown providing a support for semiconductor device 203, and providing a thermal dissipation path. The bottom surface (as oriented in FIG. 2) of die pad 201 is exposed from the package body and provides a thermal path out of the package 200. A die attach 205, which can be a conductive die attach film, is used to attach and thermally couple the die 203 to the die pad 201. The die attach film may be electrically conductive and die pad 201 can be coupled to ground, for example. In some alternative arrangements the die attach film 205 may be insulating, and the die 203 may be isolated from the die pad 201.

Bond wire 208 electrically couples semiconductor device 203 to a lead 110. Bond wire 208 can be a copper, gold, silver, aluminum, coated copper or other bond wire used in semiconductor packages. A plated copper bond wire can be used. In wire bonding, a ball formed at the end of a wire in a capillary is bonded to the surface of the semiconductor die 203 at a bond pad (not shown). As the capillary moves away from the ball bond the wire extends through the capillary to form the wire bond 208. As the tool reaches the lead 110, a stitch or wedge bond is formed on the conductive surface of lead 110, and the wire is severed by a flame or by cutting, a flame then forms a new ball on the tool and leaving a small tail on the wedge bond 211. By rapidly repeating these steps in an automated process, tens, hundreds or thousands of wire bond connections can be formed, coupling the semiconductor device 203 to leads such as 110. Alternative wire bonding processes use wedge-wedge bonding without the ball at one end of the wire bond, instead a wedge bond is formed at both the starting end and the finish end for each wire bond. Ribbon bonding can be used as alternative to wire bonding. A mold compound 207 covers the bond wire 208 including the ball and the stitch bonds, the semiconductor deice 203, the die attach 205, and portions of the die pad 201 and the lead 110. Portions of the leads 110, and the die pad 201, are left exposed to form terminals for the QFN package 200. Using SMT with these terminals, the QFN device can be mounted to a system board.

Figure 3:
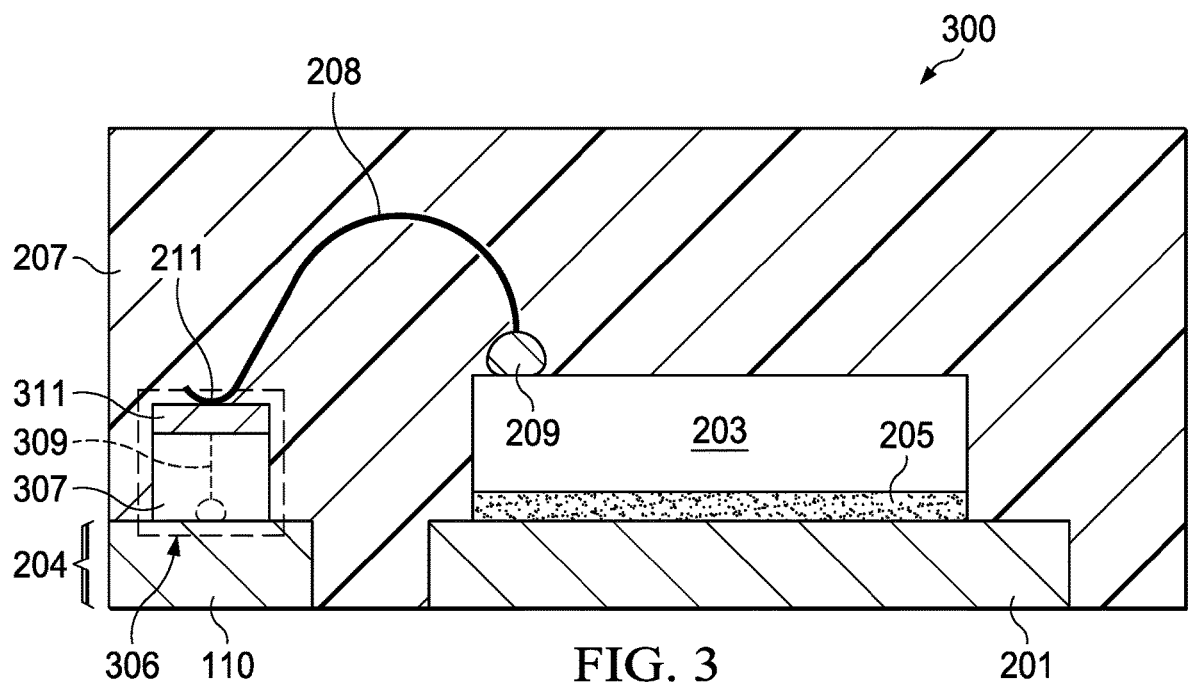
FIG. 3 is a cross section of an arrangement including a fuse in a packaged electronic device.

FIG. 3 illustrates, in a cross section, a QFN package 300 including a fuse of the arrangements. In FIG. 3, package substrate 204, for example a metal lead frame, has a lead portion 110 and die pad 201. Mold compound 207 covers a semiconductor die 203, die attach 205, and die pad 201, as well as the bond wire 208 with ball bond 209 on the semiconductor die and stitch bond 211. Fuse 306 is formed on lead 110 and includes a fuse body 307 around fuse element 309 (shown dashed as it is inside fuse body 307) and a conductive cap 311.

The fuse element 309 can be a bond wire, ribbon bond, or other conductive element sized to carry current from the semiconductor die 203 to the lead 110 and to an external load. Normally the current flows through fuse element 309. In a case of an overcurrent, where the amount of current determined by the size and materials used in fuse element 309, the fuse element 309 will melt and open, stopping current flow to lead 110. The body 307 of the fuse 306 keeps the mold compound 207 from reaching the fuse element 309. This prevents unwanted conductive paths from forming in the mold compound when the fuse element 309 melts, and improves reliability of the fuse 306. While the example arrangement is shown in a QFN package, other package types can be used, including packages where a fuse can be formed on a trace or lead and connected serially between a semiconductor die and a package terminal. Examples include leaded packages such as quad flat plastic (QFP) packages, dual in line packages (DIP), small outline integrated circuit (SOIC) packages, single in line packages (SIPP), and thin leaded and no-lead packages. When a face up die is electrically connected to a conductive portion of a package substrate by wire bonds or ribbon bonds, a fuse of the arrangements can be formed or provided on the conductive portion, and can be serially connected between the semiconductor die and the package substrate, to protect a load or system coupled to the semiconductor die from an overcurrent. Many different package types are useful with the fuses of the arrangements.

The fusing current, a current where the fuse element will melt and open, is a predetermined current determined by the material, diameter and length of the fuse element and by the needs of the application. Ribbon bond and bond wire materials that are useful in the arrangements include gold, copper, and aluminum. Gold and copper have higher fusing currents for a given diameter. Stud bump materials often include gold. Example fusing currents for 25 micron diameter fuse elements at typical lengths include, for aluminum bond wire, Al, approximately 0.5 Amps at a 10 millimeter length. Fusing current varies inversely with bonding wire length and is non-linear, for very short lengths the fusing current is greater, as wire length increases the fusing current falls to a stable value, without changing for additional length. For copper and gold bond wire, Cu and Au, at 25 micron diameter at 10 millimeters of length, fusing currents expected are about 0.5 Amps. Larger diameter fusing elements can be used to carry larger currents, for a 70 micron diameter Al bond wire, fusing current is about 2 Amps, while copper and gold fusing currents are about 3 amps. Heavy aluminum bond wire can be used to accommodate higher fusing currents, for example a heavy aluminum bonding wire of 250 micron diameter has a fusing current of 10 Amps. Even larger currents can be handled using larger diameter fuse elements. To handle additional current, in some arrangements additional bond wires or ribbon bonds can be arranged in parallel to form the fuse elements. In designing the fuse element for an application, simulation tools can be used to ensure the material chosen for the fuse elements can provide the necessary fusing current.

Figure 4A:
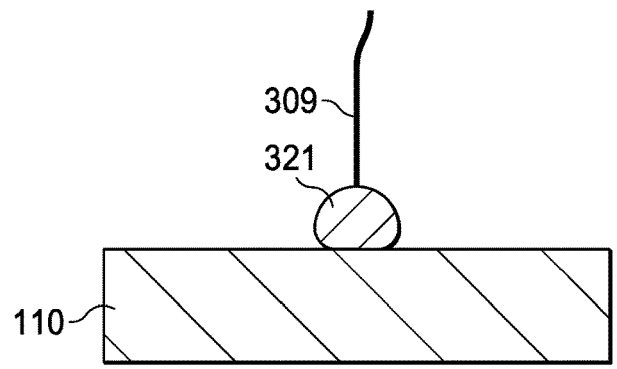
FIGS. 4A-4C illustrate in cross sectional views selected steps in forming a fuse of the arrangements.
Figure 4B:
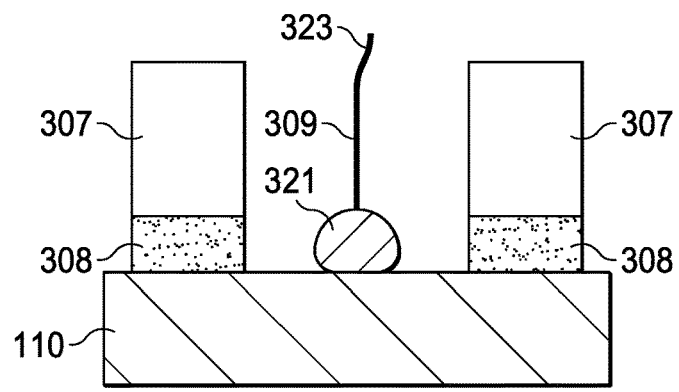
Figure 4C:
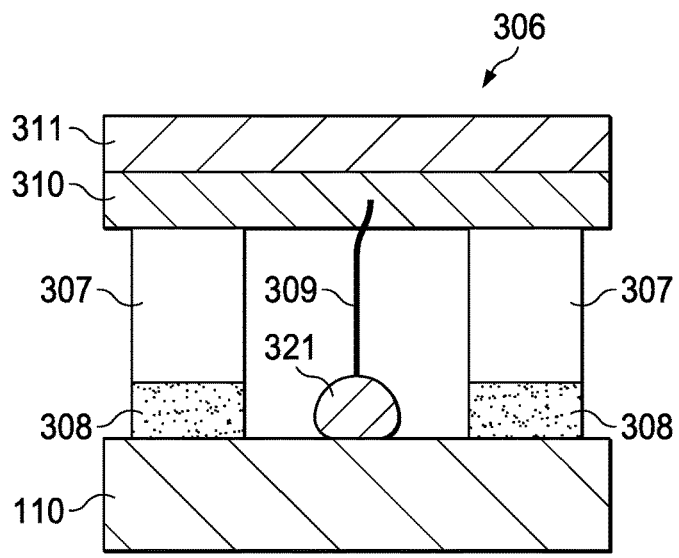

FIGS. 4A-4C illustrate, in a series of cross sections, selected steps in forming fuse 306. The arrangements use steps compatible with existing packaging steps for semiconductor devices. In packaging a semiconductor device, a package substrate is provided. In one example, a copper lead frame is provided in strips or arrays, each unit of the strip or array having a die pad portion and leads spaced from the die pad portion. In another example, a molded interconnect substrate (MIS) is provided with conductive leads and die pads in a dielectric material. Semiconductor device dies are mounted to the die pad portions of the package substrates using die attach adhesives, or die attach films. After mounting, the dies are coupled to leads of the package substrates using a wire bonding tool or a ribbon bonding tool to form wire bonds between the semiconductor dies and the leads of the unit lead frames. Following wire bonding, a molding process such as a transfer molding operation is used to cover the semiconductor devices and the bond wires in a mold compound, this process is often referred to as "encapsulation", however as used herein an "encapsulated" device may have portions not covered by the mold compound, for example surfaces of the leads 110 and the die pad 201 may remain exposed for use in thermal and electrical coupling to a board or module.

In certain arrangements, wire bonding tools, or ribbon bonding tools, and other existing processes are used to form a fuse within the semiconductor device packages during the device packaging process. The fuse is formed "in situ" contemporaneously with packaging processes for the semiconductor die. In the example of FIGS. 4A-4C, the fuse formation begins at the wire bonding stage. As shown in FIG. 4A, a fuse element 309 is formed on a portion of a lead 110. In an example process, the fuse element 309 is formed using a "stud bump." A "stud bump" can be formed with a wire bonding tool by attaching a ball bond to the lead 110, extending bond wire vertically from the ball bond, and severing the bond wire to form a vertical "stud." In this example arrangement, the fuse element 309 can be formed in this manner. In a semiconductor packaging process flow, this can be conveniently done after die mounting, and before semiconductor device wire bonding. In an alternative to wire bonding, a ribbon bonding tool can form a stud bump.

FIG. 4B shows in another cross section the fuse element 309 of FIG. 4A after further process steps, with fuse element 309 now surrounded by a fuse body 307. Fuse body 307 can be formed from a semiconductor substrate such as silicon. Fuse body 307 can be another available substrate material that is easily patterned such as glass. The fuse body 307 can have a square, rectangular, circular, or oval cross section and has an opening for fuse element 309 to extend through. In order to ensure electrical isolation between the elements, a non-conductive die attach film or other non-conductive epoxy 308 is used to attach the fuse body 307 to the lead 110. The fuse element 309 extends from a ball bond 321 on the lead 110 to a distal end 323 that extends above the package body 307 (above the package body as the elements are oriented in FIGS. 4A-4C).

FIG. 4C illustrates a fuse 306 formed from the structure of FIG. 4B after additional processing steps. In FIG. 4C, the fuse element 309 is covered by and electrically coupled to a fuse cap 311, which is electrically coupled to the fuse element 309 by solder 310. The fuse cap 311 is also coupled to the fuse body 307 by the solder 310. The fuse element is in electrical contact with the fuse cap 311, which in this example can be of copper. The fuse body 307 is insulated from the lead 110 by the non-conductive die attach film 308. When current is applied to the fuse 306, it will flow from the fuse cap 311 (from a bond wire or ribbon wire connection, see FIG. 3 above) through the fuse element 309 and to the lead 110. When lead 110 is coupled to an external load, the current flows from the semiconductor device to the load flows through the fuse element 309. If the current flowing exceeds a predetermined fusing current for the fuse element 309, the fuse element will melt, forming an open, and current will stop flowing.

Figure 5A:
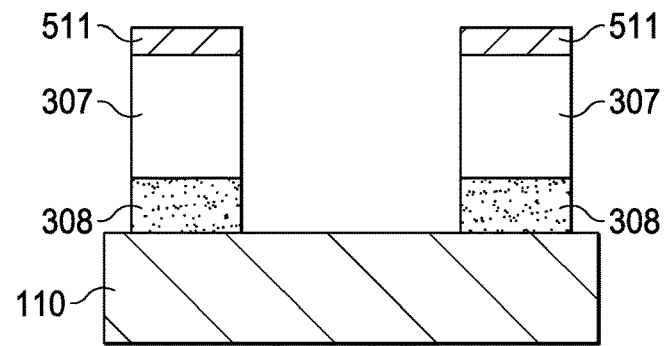
FIGS. 5A-5C illustrate in cross sectional views selected steps in forming an alternate fuse of the arrangements.
Figure 5B:
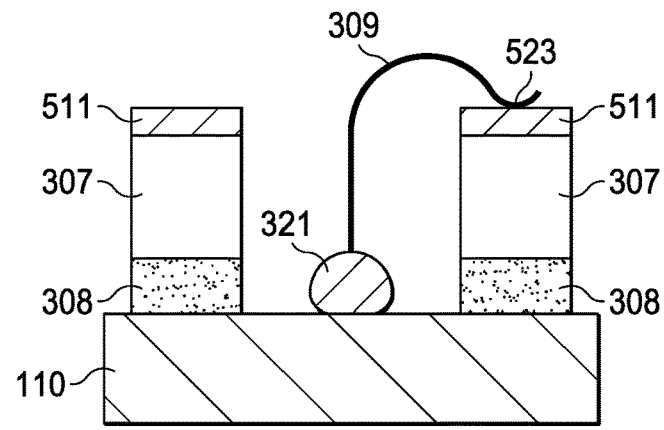
Figure 5C:
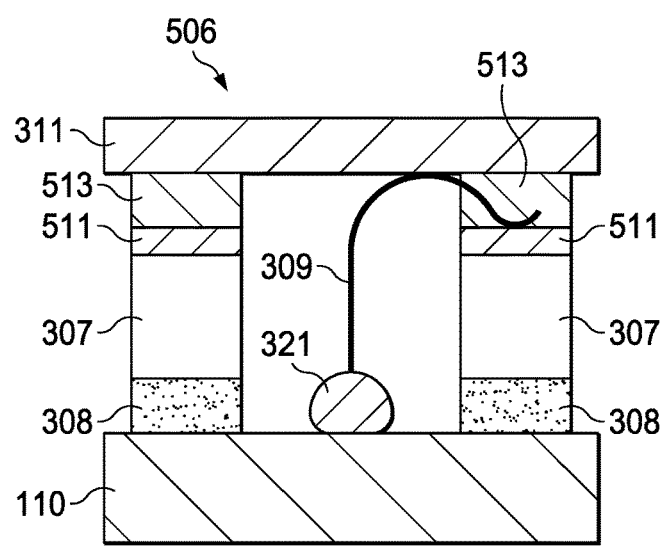

FIGS. 5A-5C illustrate in cross sectional views an alternative process for forming a fuse on a lead 110 of a semiconductor device package. In FIG. 5A, lead 110 has fuse body 307 attached using a non-conductive adhesive, epoxy, or a non-conductive die attach film 308. The die attach film 308 is open in the center of the fuse body 307 to allow a fuse element to be mounted on the lead 110. An aluminum layer 511 is placed on the top of the fuse body 307 for bonding. These steps can be performed before or after a die mounting operation when packaging semiconductor dies to a package substrate, such as a metal lead frame, that includes leads 110.

FIG. 5B illustrates in a cross section the structure of FIG. 5A after additional process steps. In FIG. 5B, the fuse element 309 has been formed on lead 110 by a ball and stitch or ball and wedge bonding process. Ribbon bonding can be used to form the fuse element. Fuse element 309 is formed by ball bonding a bond wire to the lead 110, forming ball bond 321 on lead 110. The bond wire is allowed to extend away from ball bond 321 and is looped over to one side of the fuse body 307 and bonded to aluminum layer 511 at the stitch bond 523. Using the aluminum layer 511 provides a material suitable for wire bonding, other materials could be used.

FIG. 5C shows the fuse 506 after additional process steps are performed on the structure of FIG. 5B. In FIG. 5C, a solder layer 513 and a fuse cap 311 are placed on the fuse body 307. The solder can be thermally reflowed to secure the fuse cap 311, which is a conductive metal such as copper. The end of the fuse element 509 at stitch bond 523 is electrically coupled to the fuse cap 311 by solder 513, and to the aluminum layer 511. The non-conductive die attach film 308 ensures that the cap 311 is only coupled to the lead 110 by the fuse element 309. When current flows through lead 110, it necessarily flows through the fuse element 309, and when an overcurrent occurs, fuse element 309 will melt and open, stopping current to a load. The fuse cap 311 and the fuse body 307 with the solder layer 513, the aluminum layer 511, and the non-conductive die attach film 308, ensure that when the fuse 506 is packaged by encapsulation with mold compound, the fuse element 309 is isolated from the mold compound, preventing unwanted conduction paths from forming in the mold compound on an overcurrent event.

Figure 6A:
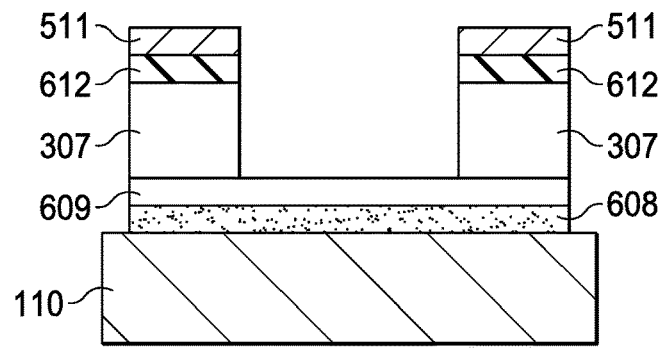
FIGS. 6A-6C illustrate in cross sectional views selected steps in forming an additional alternate fuse of the arrangements.
Figure 6B:
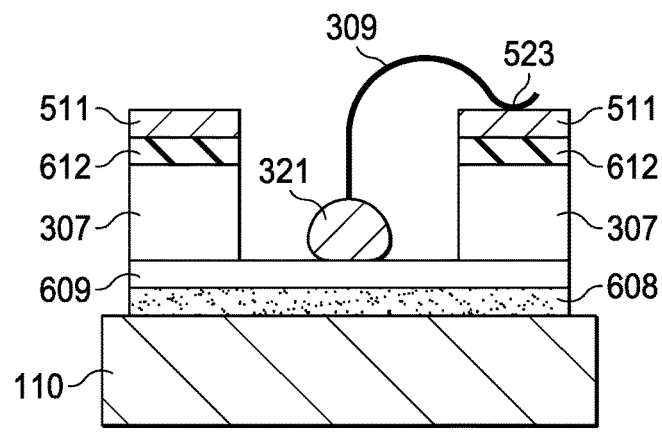
Figure 6C:
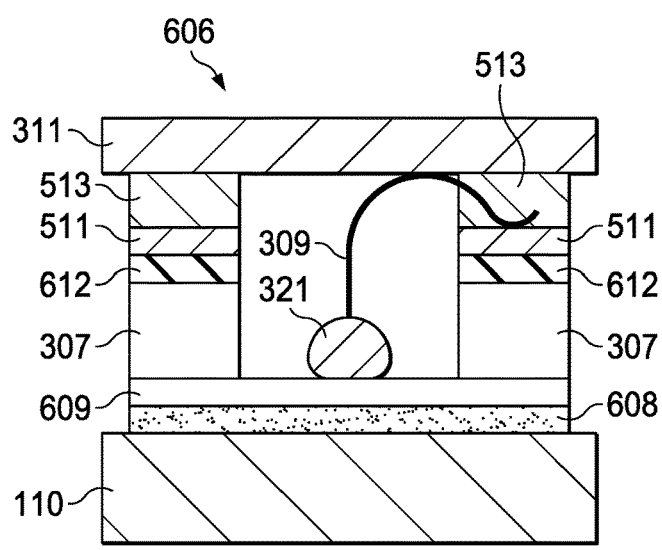

FIGS. 6A-6C illustrate, in cross sectional views, the steps for forming a fuse arrangement using another alternative process. FIG. 6A shows a fuse body 307 mounted to lead 110. The fuse body is mounted to the lead using conductive die attach material 608. The conductive die attach film 608 covers the surface of the lead 110 including within the interior of fuse body 307. A surface suitable for receiving a ball bond is needed. In FIG. 6A, a through silicon via (TSV) membrane 609 is shown over the conductive die attach material 608. The fuse body 307 can be of silicon or another semiconductor material. To insulate the upper surfaces of the fuse body 307 from the lead 110, an insulating dielectric 612 is used. This dielectric 612 can be an oxide such silicon dioxide, other insulating dielectrics such as silicon nitride can be used, and multiple layers of dielectric can be used for dielectric 612. An aluminum layer 511 is formed on the dielectric 612 over fuse body 307 to create a bondable surface.

FIG. 6B illustrates, in a cross section, the structure of FIG. 6A after additional processing. In FIG. 6B the fuse element 309 is formed in the same manner as in FIG. 5B, a wire bonding tool or a ribbon bonding tool forms a ball bond 321 to the layer 609, the conductive TSV film 609 and the conductive die attach 308 electrically coupling the ball bond 321 to the lead 110. The distal end of the fuse element is stitch or wedge bonded to the aluminum 511 with bond 523.

FIG. 6C illustrates in a cross sectional view a fuse 606 formed from the structure of FIG. 6B after additional processing steps. In FIG. 6C, fuse 606 includes fuse cap 311, and solder 513, the solder attaching the fuse cap 311 to the fuse body at aluminum layer 511, and electrically connecting the fuse cap 311 to the fuse element 309. In supplying current through lead 110 from a semiconductor device, the fuse element 309 is in series connection with the semiconductor device and the lead 110 so that all current flowing through lead 110 flows through the fuse element 309. The fuse element 309 is sized so that if an overcurrent condition occurs, the fuse element 309 will melt and open, stopping current flowing to a load.

Referring back to FIG. 3, each arrangement for a fuse, 306 in FIG. 4C, 506 in FIG. 5C, and 606 in FIG. 6C, provides a fuse that is formed contemporaneously with the packaging processes of a semiconductor device, and prior to the wire bonding operation. The fuse body 307 and the fuse cap 311 protect the fuse element 309 and keep mold compound from contacting the fuse element 309 in each of the alternative arrangements. The fuse element in each of the arrangements protects a system or load that receives current from the semiconductor device in the package. Multiple fuses of the arrangements can be used in a single device package.

Figure 7:
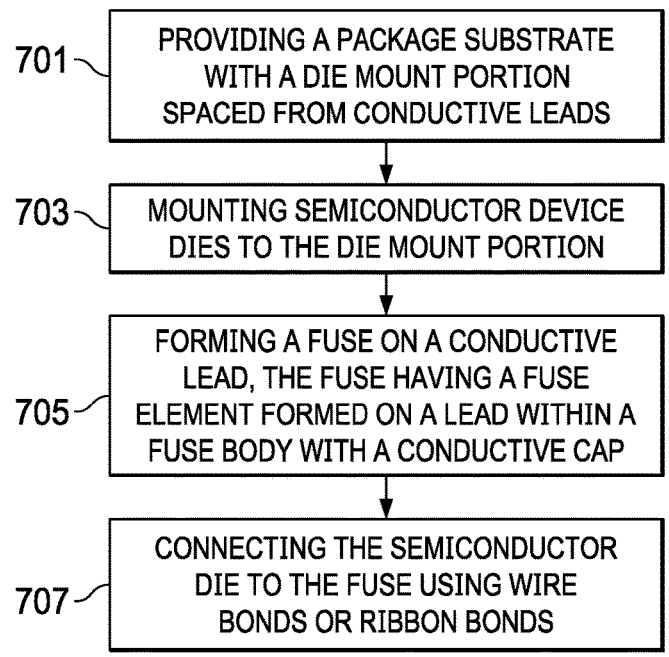
FIG. 7 is a flow diagram illustrating a method for forming an arrangement.

FIG. 7 illustrates, in a flow chart, a method for forming an "in situ" fuse of the arrangements contemporaneously with packaging a semiconductor device. At step 701, a package substrate such as a lead frame is provided with a die mounting portion and lead spaced from the die mounting portion.

At step 703, one of more semiconductor dies is mounted to the die mount portion of the package substrate.

At step 705, a fuse is formed on a lead of the package substrate. The fuse includes a fuse element formed by a wire bonding operation or by a ribbon bonding operation, the fuse element having a ball bond coupled to the lead, and having a distal end coupled to a conductive fuse cap, the fuse including a fuse body surrounding the fuse element on the lead. Any of the alternative arrangements described with respect to FIGS. 4A-4C, FIGS. 5A-5C, or FIGS. 6A-6C can be used to provide the "in situ" fuse.

At step 707, a wire bonding operation couples the semiconductor die to leads of the package substrate, or to the fuse cap of the fuses. The fuses are serially coupled between the semiconductor die and the leads. In some arrangements, multiple connections are made to the fuse using bond wires or ribbon bonds, to reduce the resistance of the electrical path from the semiconductor die to the fuse.

At step 709 a molding operation covers the semiconductor die, the wire bonds, the fuse, and at least portions of the package substrate, with mold compound. Portions of the leads are left exposed to form terminals for the packaged device. The die pad of the package substrate may have a surface exposed from the mold compound to provide a thermal dissipation path for the packaged device.

Figure 8:
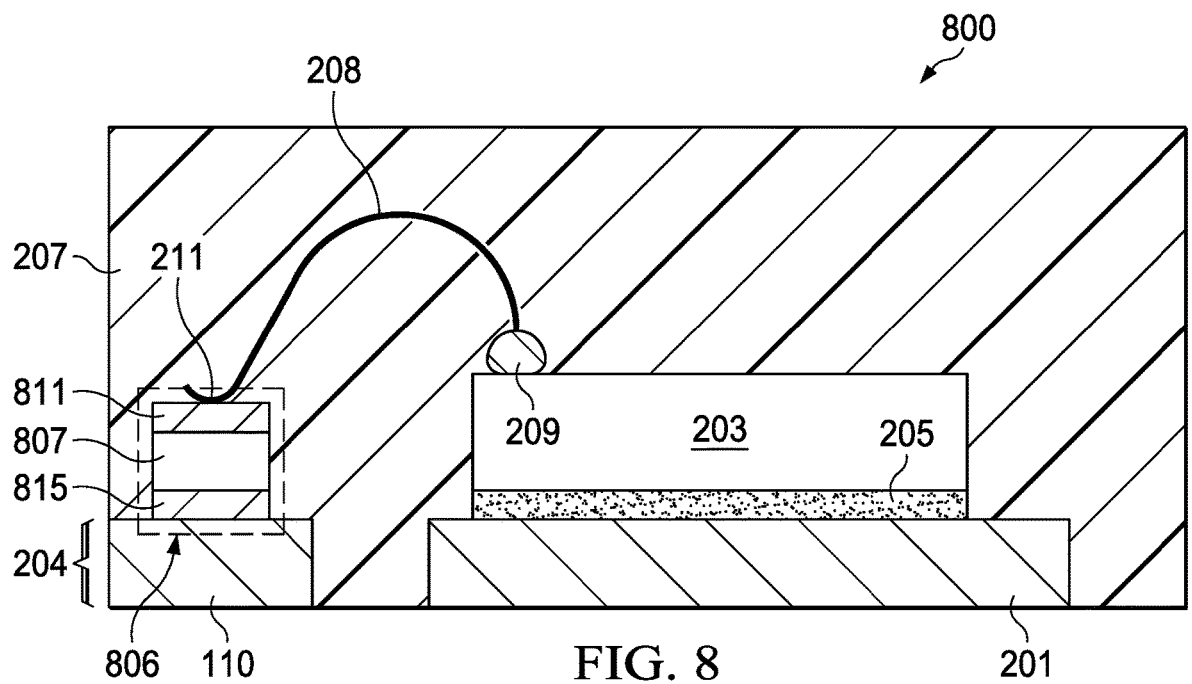
FIG. 8 illustrates, in a cross section, another arrangement including a fuse in a packaged device.

FIG. 8 is a cross sectional view of an alternative arrangement. In FIG. 8, a packaged device 800 includes semiconductor die 203, die attach 205 that attaches the semiconductor die to die pad portion 201 of a package substrate 204, a fuse component 806 that is mounted on lead 110 of the package substrate 204. A bond wire 208 connects the semiconductor die 203 with a ball bond 209 on the semiconductor die and a stitch or wedge bond on 211 on fuse 806. The fuse 806 is a passive component that is completely manufactured as a component and then mounted on lead 110 during packaging processes. Fuse 806 has a fuse cap 811, a fuse body 807, and a bottom plate 815. A fuse element (not shown in FIG. 8) is formed within the fuse 806 and is spaced from the mold compound 207 by the fuse body, the fuse cap and bottom plate. The fuse is serially connected between the semiconductor die 203 and lead 110 and carries the current flowing from the semiconductor die to lead 110. When an overcurrent condition exists, the fuse element within the fuse 806 will melt and open, stopping the current flow. Fuse 806 can be made using a metal plated wafer, such as a silicon or glass wafer, and the opening for the fuse element can be made using laser drilling, etch, or a combination of drilling and etch processes. The fuse element can be formed using stud bumping or wire bonding tools. The fuse cap can be a plated layer, or a foil or sheet applied to the wafer. After the fuses are completed, wafer dicing tools can be used to separate the fuses from the wafer. Pick and place tools can be used to place the fuse or fuses on the leads of the package substrates. Solder or other conductive adhesives can be used to electrically connect and mount the fuses to the leads.

Figure 9A:
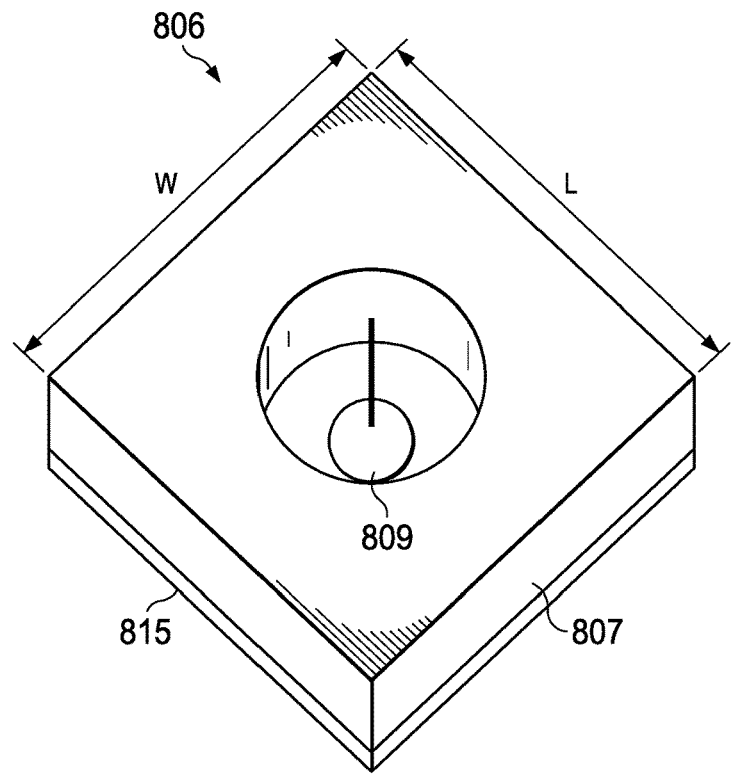
FIGS. 9A-9B illustrate in projection views a fuse arrangement for use of the arrangement in various steps of manufacturing.
Figure 9B:
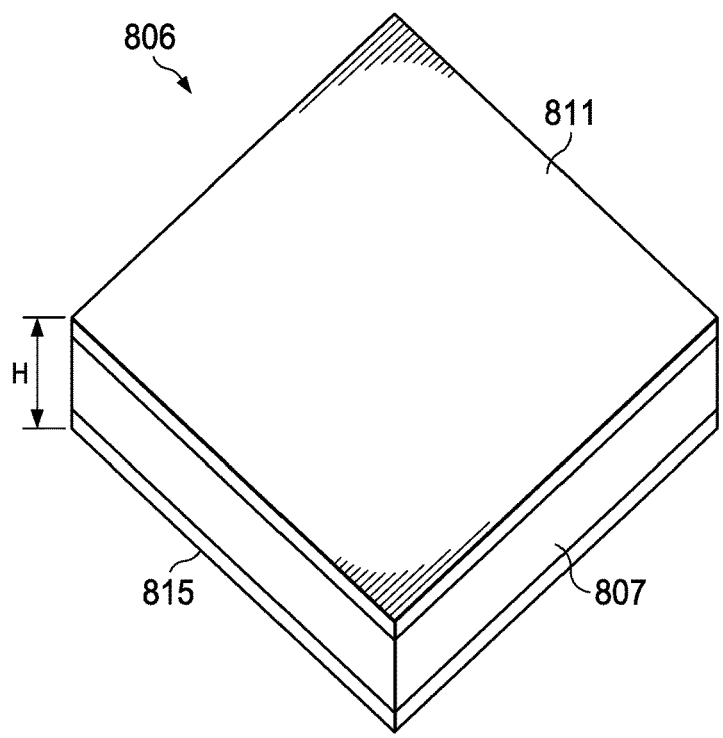

FIGS. 9A-9B illustrate, in projection views, fuse component 806 with the fuse cap omitted for visibility in FIG. 9A, and the fuse cap included in FIG. 9B. In FIG. 9A, the fuse 806 includes the fuse element 809, the fuse body 807, and the bottom plate 815. The bottom plate can be a conductive metal, such as copper, other metals and alloys can be used. The package body can be a semiconductor such as silicon, or another material such as glass. The fuse element 809 can be formed using stud bumping, wire bonding or similar tools to attach a wire to the bottom plate in the opening in the fuse body 807. FIG. 9B illustrates the completed fuse component including the bottom plate 815, the fuse body 807, and the fuse cap 811. The fuse component is a completed device that can be manufactured separately from the semiconductor packaging process and provided as a passive component to be mounted in the package. In examples, the fuse component has a width "W" of from 100 microns to 200 microns, a length "L" from 100 microns to 200 microns, and a height "H" from 50 microns to 100 microns. The size of the component fuse is determined to be compatible with pick and place tools used for assembly. The diameter of the bond wire used will affect the size. The ball bond of the fuse element 809 is formed at the bottom plate by a wire bonding tool capillary and can be about 25 microns in diameter as an example, this ball bond size depends on the wire diameter and the bonding tool used.

Figure 10:
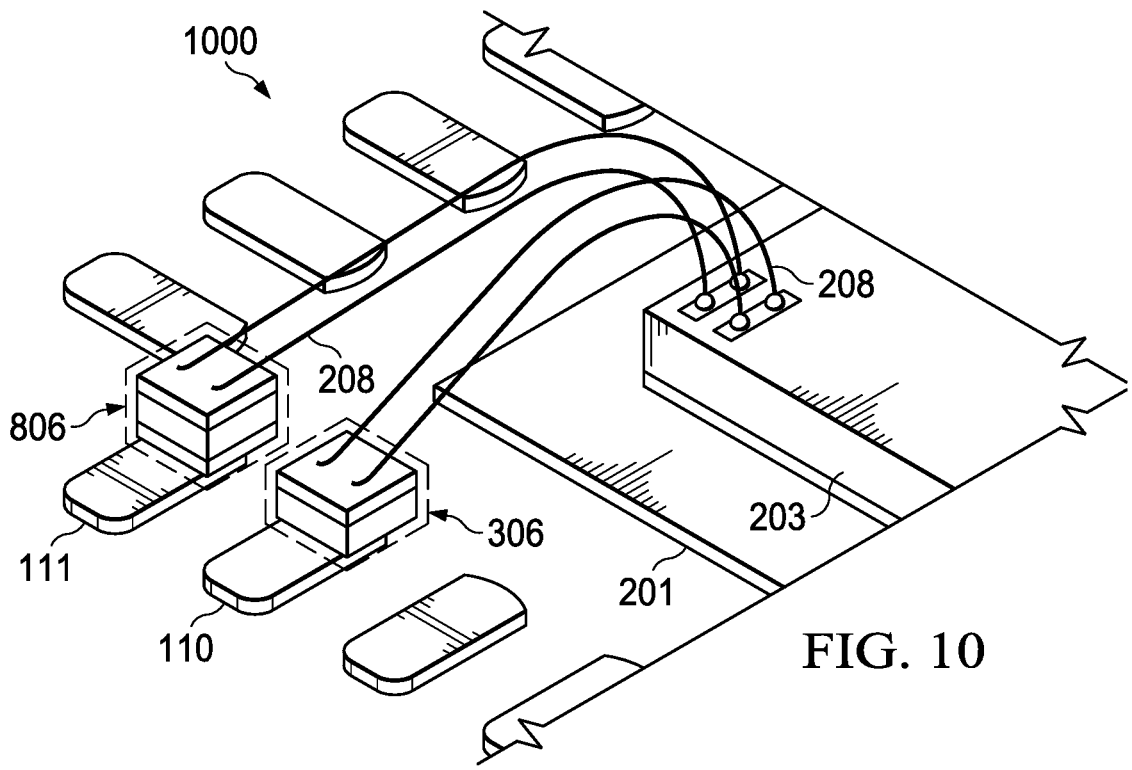
FIG. 10 illustrates in a partial projection view different fuses of the arrangements in a device package.

FIG. 10 illustrates, in a cutaway view, a semiconductor device package 1000 with an in situ fuse 306 (see FIG. 3, FIGS. 4A-4C) and a component fuse 806 (see FIG. 8, FIGS. 9A-9B) mounted to leads 110 and 111. The in situ fuse 306 has a package body formed on the lead 110, and a fuse cap. Bond wires 208 electrically couple the fuse 306 to the semiconductor die in a series connection between the lead 110 and the semiconductor die 203.

Fuse 806 is a component fuse with a bottom plate, a package body, and a fuse cap, and is mounted on a lead 111 by solder or by a conductive adhesive. Bond wires 208 connect the fuse 806 to the semiconductor die 203, and to the lead 110, in a series connection. Although in FIG. 10 pairs of bond wires 208 are shown coupled in parallel to the fuses 806, 306, the number of bond wires needed depends on the current and voltage used in the device, and can be one bond wire, two, or several. Ribbon bonds could be used in place of bond wires 208.

Both fuses 806, 306 operate to protect external circuitry by having a fuse element that melts and opens when an overcurrent exists, stopping current flow. Both fuses have a fuse element spaced from the mold compound in a semiconductor package, preventing unwanted conductive paths from forming during the melting of the fuse. Use of the arrangements allows for small (in examples, 200 ums on a side, or less, and 100 ums thick, or less) fuses placed internally within semiconductor packages, eliminating the need for the area and traces needed for a board mounted fuse or for expensive custom device packages. In some of the arrangements, wire bonding tools and other existing semiconductor packaging processes are used to form a fuse within the semiconductor device packages during the device packaging process. The fuse can be formed "in situ" contemporaneously with packaging processes for the semiconductor die. In other arrangements, component fuses are manufactured using existing packaging processes and mounted on a package substrate prior to, or during, the packaging of a semiconductor die.

Figure 11:
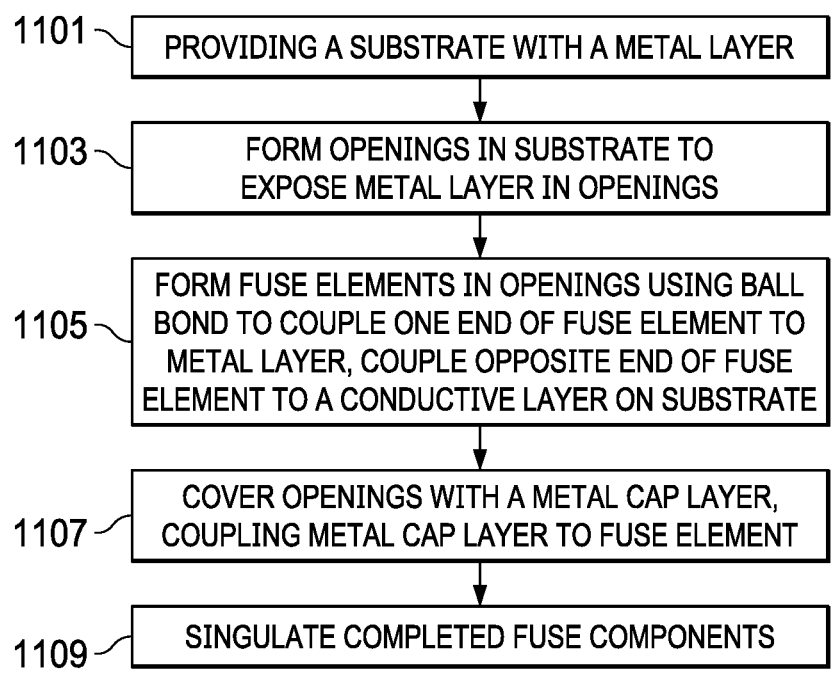
FIG. 11 is a flow diagram illustrating a method for forming a fuse for use in an arrangement.

FIG. 11 is a flow diagram illustrating selected steps of a method for forming a component fuse of the arrangements. At step 1101, a substrate is provided with a metal layer on one surface. The metal layer will form a bottom plate for the fuse. A copper layer, for example, can be used. The substrate will form a fuse body, and may be a semiconductor substrate, for example a silicon substrate. Glass substrates can also be used. At step 1103, openings are formed in the substrate to expose the metal layer within the openings. Etch processes, laser drilling processes, and other through silicon via (TSV) or hole forming processes can be used. At step 1105, fuse elements are formed in the openings of the substrate using ball bonding, or ribbon bonding material, to couple one end of the fuse element to the substrate. A second end of the fuse element can be bonded to a layer over the substrate, such as a conductive layer of aluminum. Any of the methods for forming arrangements of FIG. 4A-4C, 5A-5C, or 6A-6C, can be used to form the fuse elements in the openings. At step 1107, the fuse elements and openings are covered with a fuse cap layer of metal. For example, a copper layer can be used. The copper layer can be bonded or plated. Foils can be used. The cap layer is electrically coupled to one end of the fuse element, with the bottom layer coupled to the other end, so that the fuse element is electrically serially coupled between the cap layer and the bottom layer. As shown in FIGS. 4A-4C, 5A-5C, and 6A-6C, insulating material is formed between the cap layer and the bottom layer so that any current flowing between the cap layer and the bottom plate flows through the fuse elements.

At step 1109, the completed fuse components are removed from the substrate by sawing or singulation processes to form component fuses.

Figure 12:
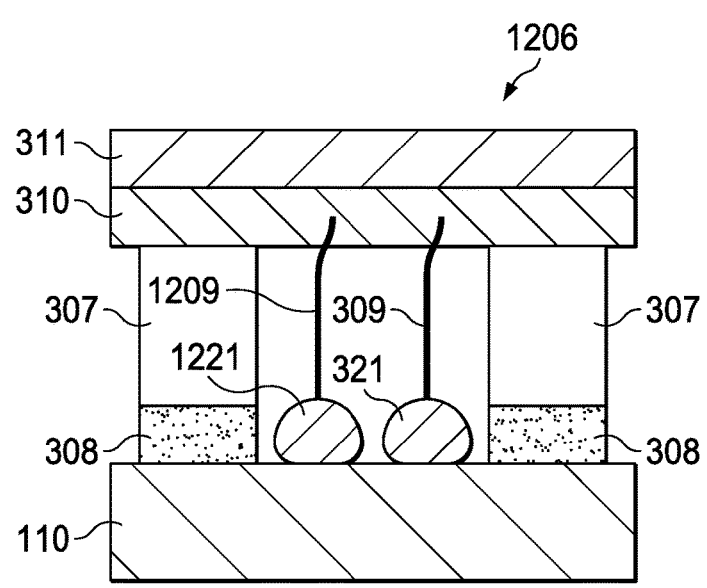
FIG. 12 illustrates in a cross sectional view an alternate fuse arrangement.

In an alternative arrangement shown in a cross sectional view in FIG. 12, two bond wires are connected in parallel to form two fuse elements 309, 1209. As shown in FIG. 12 and similar to FIG. 4A, a fuse element 309 is formed on a portion of a lead frame lead 110. In this alternative arrangement, a fuse that can carry additional current is needed. In the arrangement, a second fuse element 1209 is formed adjacent to and in parallel with the fuse element 309. In the example process, the fuse elements 309 and 1209 are formed using bond wires to form a "stud bump." A "stud bump" can be formed with a wire bonding tool by attaching ball bonds 321, 1221 to the lead 110, extending bond wire vertically from the ball bond, and severing the bond wire to form a vertical "stud" as described above with respect to FIGS. 4A-4C. Fuse body 307 surrounds the two fuse elements and can be formed from a semiconductor substrate such as silicon. Fuse body 307 can be another available substrate material that is easily patterned such as glass. The fuse body 307 can have a square, rectangular, circular, or oval cross section and has an opening for fuse elements 309 and 1209 to extend through. In order to ensure electrical isolation between the elements, a non-conductive die attach film or other non-conductive epoxy 308 is used to attach the fuse body 307 to the lead 110. The fuse elements 309 and 1209 extend from ball bonds 321, 1121 on the lead 110 to a distal ends covered by a fuse cap 311 that is attached to the distal ends of the fuse elements 1209, 309 by a solder 310. Similar alternative arrangements can be formed using two or more fuse elements in parallel for the fuse elements of FIGS. 5A-5C, 6A-6C, and for the component fuse arrangements of FIGS. 9A-9B.

Modifications are possible in the described arrangements, and other alternative arrangements are possible within the scope of the claims.

What is claimed is:

1. An apparatus, comprising:
    a package substrate having a die pad configured for mounting a semiconductor die, and leads spaced from the die pad;
    a semiconductor die mounted on the die pad;
    a fuse mounted to a lead, the fuse having a fuse element coupled between a fuse cap and the lead, the fuse having a fuse body with an opening surrounding the fuse element, the fuse cap attached to the fuse body;
    electrical connections coupling the semiconductor die to the fuse; and
    mold compound covering the semiconductor die, the fuse, the electrical connections, and a portion of the package substrate, with portions of the leads exposed from the mold compound to form terminals.

2. The apparatus of claim 1, wherein the fuse element comprises a bond wire that is ball bonded to the lead at a first end, and the bond wire having a bond connecting a second end to a conductive layer on the fuse body, and the fuse cap is attached to the fuse body and electrically connected to the fuse element.

3. The apparatus of claim 2, wherein the bond wire comprises a bond wire selected from copper, gold, aluminum, silver, coated copper, and alloys thereof.

4. The apparatus of claim 2, wherein the bond wire has a diameter between 25 microns and 80 microns.

5. The apparatus of claim 1, wherein the fuse element comprises a ribbon bond.

6. The apparatus of claim 1, wherein the electrical connections further comprise one selected from bond wires or ribbon bonds.

7. The apparatus of claim 6 wherein the bond wires comprise one selected from gold, copper, aluminum, silver, and alloys thereof.

8. The apparatus of claim 1, wherein the fuse further comprises:
    the fuse element, comprising a bond wire ball bonded to the lead at a first end and extending to a second end spaced from the lead;

a fuse body with an opening surrounding the fuse element, the fuse body attached to the lead with a non-conductive die attach; and solder coupled to the second end of the fuse element and to the fuse cap, the solder making an electrical connection between the fuse cap and the fuse element.

9. The apparatus of claim 8 wherein the fuse element comprises a first fuse element and the bond wire comprises a first bond wire, and further comprising a second fuse element that comprises a second bond wire that is coupled in parallel to the first bond wire.

10. The apparatus of claim 1, wherein the fuse further comprises:
a fuse body attached to the lead by a non-conductive die attach, and having an opening, with a conductive layer on a surface of the fuse body;
the fuse element comprising a bond wire ball bonded to the lead in the opening of the fuse body at a first end and extending to a second end bonded to the conductive layer; and
solder covering the second end of the fuse element and attaching the fuse cap to the fuse body, the solder electrically connecting the fuse cap to the fuse element and to the conductive layer.

11. The apparatus of claim 1, wherein the fuse further comprises:
a fuse body attached to the lead by a non-conductive die attach, and having an opening, with a conductive layer on a surface of the fuse body;
a fuse element comprising a bond wire ball bonded to the lead in the opening of the fuse body at a first end and extending to a second end bonded to the conductive layer; and
solder covering the second end of the fuse element and attaching the fuse cap to the fuse body, the solder electrically connecting the fuse cap to the fuse element.

12. The apparatus of claim 1, wherein the fuse further comprises:
a fuse body attached to the lead by a through silicon via membrane mounted to the lead by a conductive die attach, and having an opening;
a fuse body mounted on the through silicon via membrane, with an insulating dielectric layer on a surface of the fuse body, and a conductive layer on the insulating dielectric;
a fuse element comprising a bond wire ball bonded to the lead in the opening of the fuse body at a first end and extending to a second end bonded to the conductive layer; and
solder covering the second end of the fuse element and attaching the fuse cap to the fuse body, the solder electrically connecting the fuse cap to the fuse element.

13. The apparatus of claim 1, wherein the mold compound comprises a thermoset epoxy resin.

14. The apparatus of claim 1, wherein the fuse has a fuse element with a fusing current of between −0.5 Amps and 3 Amps.

15. An apparatus, comprising:
a package substrate including a die pad and leads spaced from the die pad;
a semiconductor die mounted to the die pad;
a fuse mounted on a lead, the fuse electrically coupled between the semiconductor die and the lead; and
mold compound covering the semiconductor die, the fuse, and a portion of the package substrate, with portions of the leads exposed from the mold compound to form terminals.

16. The apparatus of claim 15, wherein the fuse is a component mounted to the lead and further comprises:
a bottom plate mounted to the lead, a fuse element mounted to the bottom plate and extending to a fuse cap, the fuse element serially coupled between the fuse cap and the bottom plate, and a fuse body surrounding the fuse element, the fuse body, bottom plate and fuse cap enclosing the fuse element and spacing the fuse element from the mold compound.

17. The apparatus of claim 16, wherein the fuse element comprises a bond wire that is less than 75 microns in diameter.

18. The apparatus of claim 16, wherein the fuse element is a first fuse element, and further comprising a second fuse element coupled in parallel to the first fuse element.

19. The apparatus of claim 16, wherein the component is less than 200 microns on a side, and has a thickness of less than 100 microns from an exterior of the fuse cap to an exterior of the bottom plate.

20. The apparatus of claim 16, wherein the fuse further comprises:
a fuse element having a first end mounted to the bottom plate;
a fuse body having an opening and surrounding the fuse element, the fuse body mounted to the bottom plate with non-conductive die attach and having a conductive layer on a surface of the fuse body, a second end of the fuse element attached to the conductive layer; and
a fuse cap mounted on the fuse body, the fuse cap electrically coupled to the fuse element and the conductive layer, and the fuse element serially coupled between the fuse cap and the bottom plate.

21. The apparatus of claim 20 wherein the fuse element comprises a bond wire that is ball bonded to the bottom plate and having a bond to a conductive layer on the fuse body.

22. The apparatus of claim 21 wherein the fuse element comprises a first fuse element, the bond wire comprises a first bond wire, and further comprising a second fuse element that comprises a second bond wire coupled in parallel to the first bond wire.

23. A method, comprising:
mounting a semiconductor die on a die pad of a package substrate, the package substrate having leads spaced from the die pad;
forming a fuse on a lead by performing;
forming a fuse element of bond wire by ball bonding one end of the fuse element to a lead, the fuse element having a second end extending away from the lead, placing a fuse body having an opening on the lead, the fuse element in the opening of the fuse body, and placing a fuse cap over the fuse body and the opening, the fuse cap electrically connected to the second end of the fuse element;
making electrical connections between the semiconductor die and the fuse, the fuse serially coupled between the semiconductor die and the lead; and
covering the semiconductor die, the electrical connections, the fuse, and portions of the package substrate with mold compound.

24. The method of claim 23, wherein forming the fuse further comprises:
connecting the fuse cap to the fuse element using solder.

25. The method of claim 23, wherein forming the fuse further comprises:
forming a conductive layer over the fuse body;
bonding the second end of the fuse element to the conductive layer; and connecting the fuse cap to the second end of the fuse element and the fuse body using solder.

26. A method, comprising:

forming a metal layer on one surface of a substrate;

forming openings through the substrate, exposing a surface of the metal layer in the openings;

forming fuse elements in the openings by ball bonding one end of a bond wire to the metal layer, the fuse elements having a second end extending from the metal layer and through the openings;

forming a fuse cap layer over the openings and the fuse elements, the fuse cap layer being a conductive metal layer electrically connected to the second end of the fuse elements; and separating fuses from the substrate, each fuse having one fuse element in an opening electrically coupled to the metal layer and the cap layer, the metal layer forming a bottom layer of a fuse.

27. The method of claim 26, and further comprising:

mounting a fuse on a lead of a package substrate, the bottom layer of the fuse attached to and electrically connected to the lead, the package substrate having a die pad portion and additional leads spaced from the die pad portion;

mounting a semiconductor die on the die pad portion;

electrically connecting the semiconductor die to the fuse cap of the fuse, the fuse element being in series connection between the semiconductor die and the lead; and covering the semiconductor die, the electrical connection, the fuse and a portion of the package substrate with mold compound.

28. The method of claim 27, wherein the fuse element in the fuse is configured to carry current from the semiconductor die to the lead, and the fuse element is configured to melt and open, stopping the current, when the current flowing in the fuse element exceeds a predetermined current.

* * * * *